(12) United States Patent
Yu et al.

(10) Patent No.: US 11,003,069 B2
(45) Date of Patent: May 11, 2021

(54) HIGH DURABILITY EXTREME ULTRAVIOLET PHOTOMASK

(71) Applicant: Taiwan Semiconductor Manufacturing Co., Ltd., Hsin-Chu (TW)

(72) Inventors: Chia-Hao Yu, Hsinchu (TW); Chi-Lun Lu, Hsinchu (TW); Chih-Tsung Shih, Hsinchu (TW); Ching-Wei Shen, Hsinchu (TW); Jeng-Horng Chen, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/866,368

(22) Filed: May 4, 2020

(65) Prior Publication Data
US 2020/0264503 A1    Aug. 20, 2020

Related U.S. Application Data

(60) Continuation of application No. 16/112,902, filed on Aug. 27, 2018, now Pat. No. 10,642,148, which is a division of application No. 15/169,953, filed on Jun. 1, 2016, now Pat. No. 10,061,191.

(51) Int. Cl.
*G03F 1/24* (2012.01)

(52) U.S. Cl.
CPC ..................... *G03F 1/24* (2013.01)

(58) Field of Classification Search
CPC .................... G03F 1/22; G03F 1/24
USPC ............................................. 430/5
See application file for complete search history.

(56) References Cited

U.S. PATENT DOCUMENTS

| | | |
|---|---|---|
| 8,628,897 B1 | 1/2014 | Lu et al. |
| 8,679,707 B2 | 3/2014 | Lee et al. |
| 8,691,476 B2 | 4/2014 | Yu et al. |
| 8,709,682 B2 | 4/2014 | Chen et al. |
| 8,715,890 B2 | 5/2014 | Tu et al. |
| 8,722,286 B2 | 5/2014 | Yu et al. |
| 8,753,788 B1 | 6/2014 | Yu et al. |
| 8,764,995 B2 | 7/2014 | Chang et al. |
| 8,765,330 B2 | 7/2014 | Shih et al. |
| 8,765,582 B2 | 7/2014 | Hsu et al. |
| 8,785,084 B2 | 7/2014 | Lu et al. |
| 8,828,625 B2 | 9/2014 | Lu et al. |
| 8,841,047 B2 | 9/2014 | Yu et al. |
| 8,877,409 B2 | 11/2014 | Hsu et al. |
| 9,739,913 B2 | 8/2017 | Beasley et al. |
| 2004/0091789 A1 | 5/2004 | Han et al. |
| 2013/0202992 A1 | 8/2013 | Chen et al. |
| 2013/0280660 A1 | 10/2013 | Chang et al. |
| 2015/0107617 A1 | 4/2015 | Lee et al. |
| 2015/0261082 A1 | 9/2015 | Shih et al. |
| 2015/0286146 A1 | 10/2015 | Chang et al. |
| 2015/0309405 A1 | 10/2015 | Shih et al. |
| 2015/0311075 A1 | 10/2015 | Huang et al. |
| 2016/0011344 A1 | 1/2016 | Beasley et al. |
| 2017/0351169 A1 | 12/2017 | Yu et al. |
| 2018/0373138 A1 | 12/2018 | Yu et al. |

FOREIGN PATENT DOCUMENTS

| | | |
|---|---|---|
| CN | 1869811 | 11/2006 |
| CN | 103454849 | 12/2013 |
| DE | 10223113 | 12/2003 |
| TW | M391119 | 10/2010 |
| TW | 201220978 | 5/2012 |

*Primary Examiner* — Christopher G Young
(74) *Attorney, Agent, or Firm* — Haynes and Boone, LLP

(57) ABSTRACT

The present disclosure provides an embodiment of a reflective mask that includes a substrate; a reflective multilayer disposed on the substrate; an anti-oxidation barrier layer disposed on the reflective multilayer and the anti-oxidation barrier layer is in amorphous structure with an average interatomic distance less than an oxygen diameter; and an absorber layer disposed on the anti-oxidation barrier layer and patterned according to an integrated circuit layout.

20 Claims, 11 Drawing Sheets

HIGH DURABILITY EXTREME ULTRAVIOLET PHOTOMASK

RELATED APPLICATION

The present application is a continuation application of U.S. application Ser. No. 16/112,902, filed Aug. 27, 2018, which is a divisional application of U.S. application Ser. No. 15/169,953, filed Jun. 1, 2016, each of which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. In one example associated with lithography patterning, a photomask to be used in a lithography process has a circuit pattern defined thereon and is to be transferred to wafers. A reflective mask is used during extreme ultraviolet (EUV) lithography process to form an integrated circuit having smaller feature size. However, the existing reflective mask is vulnerable to manufacturing fabrication, such as oxidation, and is easily damaged.

Therefore, what are needed are the reflective mask and the method making the same to address the above issues.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

DETAILED DESCRIPTION

Figure 1:
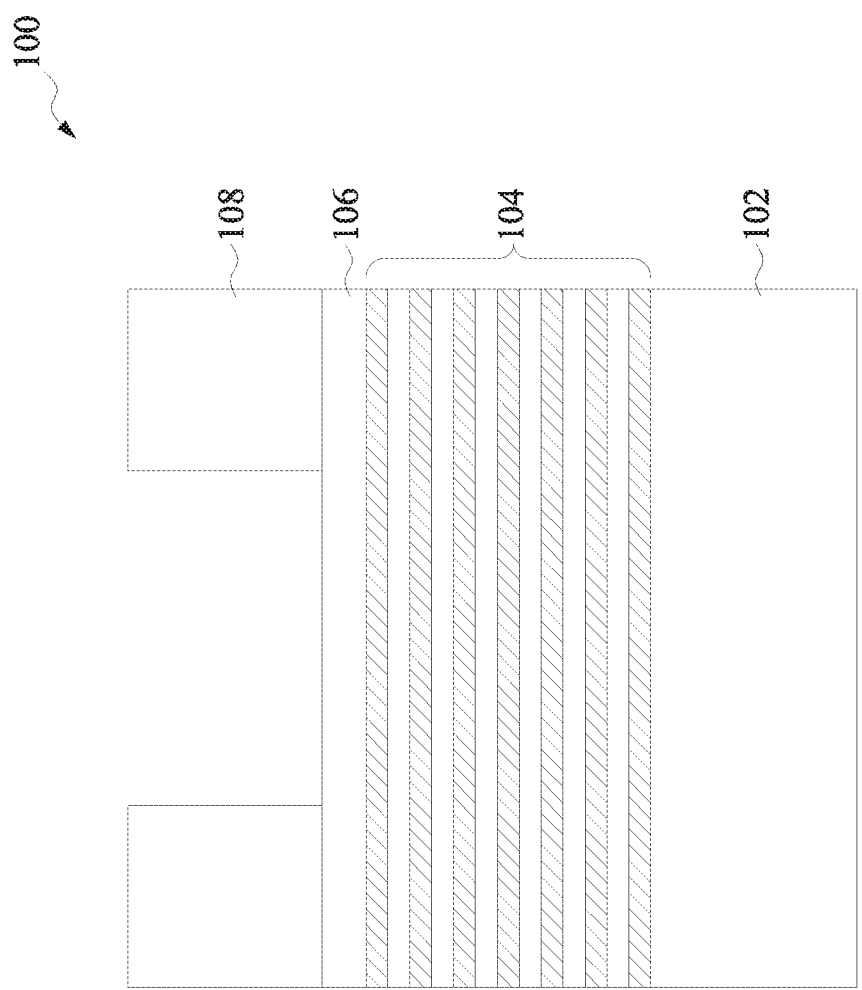
FIG. 1 is a sectional view of a reflective photo mask used in an extreme ultraviolet (EUV) lithography exposing tool in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a sectional view of a reflective photo mask (or reflective reticle or reflective mask) 100 used in an extreme ultraviolet (EUV) lithography exposing tool constructed according to one or more embodiment of the present disclosure.

The reflective mask 100 includes a substrate 102. The substrate 102 is chosen to minimize image distortion due to mask heating by the intensified illumination radiation. In the present embodiments, the substrate 102 includes a low thermal expansion material (LTEM). The LTEM may include fused quartz, silicon carbide, silicon oxide-titanium oxide alloy and/or other suitable LTEM known in the art. Alternatively, the substrate 102 includes other materials, such as quartz or glass, depending on design requirements of the mask. The substrate 102 includes materials with a low defect level and a smooth surface.

The reflective mask 100 includes a reflective multilayer (RML) 104 (also referred to as a multilayer mirror (MLM)) deposited on the substrate 102. The RML 104 is designed to reflect of the radiation light directed to the substrate 102. In one embodiment, the RML 104 includes alternating layers of two materials deposited on the top of the substrate 102 to act as a Bragg reflector that maximizes the reflection of the radiation light, such as EUV with 13.5 nm wavelength.

The combination of the two materials in the alternating layers selected to provide a large difference in refractive indices between the two layers (for example, to achieve large reflectivity at an interface of the two layers according to Fresnel equations), yet provide small extinction coefficients for the layers (for example, to minimize absorption). In an example, the RML 104 includes molybdenum-silicon (Mo/Si) layer pairs. In another example, the RML 104 includes molybdenum-beryllium (Mo/Be) layer pairs. A thickness of each layer of each layer pair of the RML 104 is adjusted depending on a wavelength and an angle of incidence of light (such as extreme ultraviolet (EUV) radiation) incident on the mask, such that the mask achieves maximum constructive interference of light reflected from different interfaces of the RML 104. In general, reflectivity of the RML 104 increases as a number of layer pairs of the RML increases. Accordingly, in principle, if the number of layer pairs is sufficiently large and extinction coefficients of the materials of the layers are close to zero, the reflectivity of the RML 104 can approach 100% regardless of the difference of the refractive indices of the materials of the layers in the layer pairs. However, in the EUV wavelength range, the highest reflectivity that can be achieved is limited by the extinction coefficients of the materials employed for the layers of the RML 104. In the present example, the number of layer pairs of the RML 104 is from twenty to eighty. For example, in the depicted embodiment, to achieve more than 90% of the maximum achievable reflectivity (with the chosen materials) of the RML 104 and minimize mask blank manufacturing time and costs, the RML 104 includes about forty layer pairs, such as forty Mo/Si pairs. In furtherance of the example, the Mo/Si pairs includes a silicon layer having a thickness of 3 nm to 5 nm (for example, about 4 nm); and a molybdenum layer having a thickness of 2 nm to 4 nm (for example, about 3 nm). Alternatively, the RML 104 includes any other number of layer pairs, depending on reflectivity specifications for the mask. In other alternatives, the RML 104 may include layer groups, in other words, groups of three or more layers having different refractive indices and other characteristics to maximize reflectivity.

In the present example, the RML 104 includes molybdenum-silicon (Mo/Si) film pairs. The RML 104 includes about 40 (Mo/Si) film pairs and each Mo/Si film pair has a collective thickness of about 7 nm.

A capping layer 106 is deposited on the RML 104. Because the capping layer 106 has different etching characteristics from an absorber layer, the capping layer 106 provides a protection to the RML 104, such as an etch stop layer in a subsequent patterning or a repairing process of the absorber layer. Furthermore, the same capping layer 106 is also designed to function as an anti-oxidation barrier layer to protect the RML 104 from oxidation. At the same time, the capping layer will not degrade the EUV reflectivity from the RML 104.

The oxidation to the mask may come from various sources, such as dry plasma-oxygen assisted etching, environment moisture, mask repairing and mask cleaning. For example, it was observed that the oxidative media used in EUV mask cleaning will introduce strong oxidation reaction of the RML 104 and changes the local silicon of the RML 104 to silica, which causes the deformation of the RML 104 of the EUV mask 100. Furthermore, the chemicals used in the electron-beam-based mask repair also induce strong oxidation reaction in the local surface, which causes the deformation of the RML 104. The existing capping layer has not enough resistance to dry plasma-oxygen assisted etching, environmental oxidation contamination, mask repairing and cleaning oxidation process.

In the present disclosure, the capping layer 106 is designed and formed to have strong capability of anti-oxidation such that to effectively prevent the reflective multilayer 104 from oxidation and is therefore also referred to as anti-oxidation barrier layer. In addition to the anti-oxidation, the capping layer 106 is designed to enough resistance to various chemicals and durability during various chemical processes, such as cleaning and etching. In some examples, the ozonated water used to make the reflective mask 100 in the subsequent process introduces damages to the capping layer made of Ru and results in a significant EUV reflectivity drop. It was further observed that after Ru oxidation, Ru oxide is easily etched away by an etchant, such as Cl2 or F2 gas. Furthermore, the capping layer 106 is properly designed without degrading the reflectivity to the EUV light used during a lithography process. In the various embodiments, the capping layer 106 is designed and formed with those considerations to address identified issues.

In some embodiments, the capping layer 106 is designed with composition and morphology to effectively prevent the diffusion of oxygen to the RML 104 through the capping layer 106. Particularly, the capping layer 106 has an amorphous structure with an average interatomic distance less than diameter of oxygen ($O_2$) molecule. In that consideration, the kinetic diameter of the oxygen molecule is more relevant to the diffusion. The kinetic diameter of the oxygen molecule is about 3 angstrom. Therefore, the average interatomic distance of the capping layer is less than 3 angstrom, thus effectively preventing the oxygen molecule from diffusing through the capping layer 106. The capping layer 106 is formed to be amorphous. It is so because the polycrystalline structure in a capping layer includes grain morphology with much large boundary interfaces between polycrystalline grains and the boundary interfaces provide paths for oxygen diffusing through and eventually degrading the RML 104 and the performance of the reflective mask 100 during a lithography process using the reflective mask 100. In some embodiments, the capping layer 106 includes alloy of ruthenium and a suitable metal "M" (RuM alloy), in which the metal "M" is highly oxygen unreactive. As noted above, RuM alloy is formed with a composition, structure and thickness to effectively prevent oxygen from diffusing through the capping layer 106. Particularly, the RuM alloy of the capping layer 106 is in an amorphous structure. In some examples, the capping layer 106 includes alloy of Ru and platinum (Pt), or RuPt alloy. In some embodiments, the metal "M" of RuM alloy is one of Po, Hg, Os, Rh, Pd, Ir, and Pt or a combination thereof. The RuM alloy is further discussed taking RuPt alloy as an example.

In the following discussion of the capping layer 106, the capping layer 106 includes RuPt alloy. Platinum is chosen since it barely reacts with oxygen. The RuPt alloy has a Ru and Pt ratio properly tuned to achieve the effectiveness of anti-oxidation. In the present example, the mass ratio of RuPt alloy ranges between 1:1 and 3.5:1. In some examples, the RuPt alloy is formed as the capping layer 106 on the RML 104 by physical vapor deposition (PVD) using a RuPt target with proper RuPt mass ratio such as the capping layer 106 of the RuPt alloy has a mass ratio ranging between 1:1 and 3.5:1. For example, the RuPt alloy in the PVD target has a similar RuPt mass ratio ranging between 1:1 and 3.5:1. The RuPt alloy may be alternatively or additionally deposited by other suitable technique.

Figure 2:
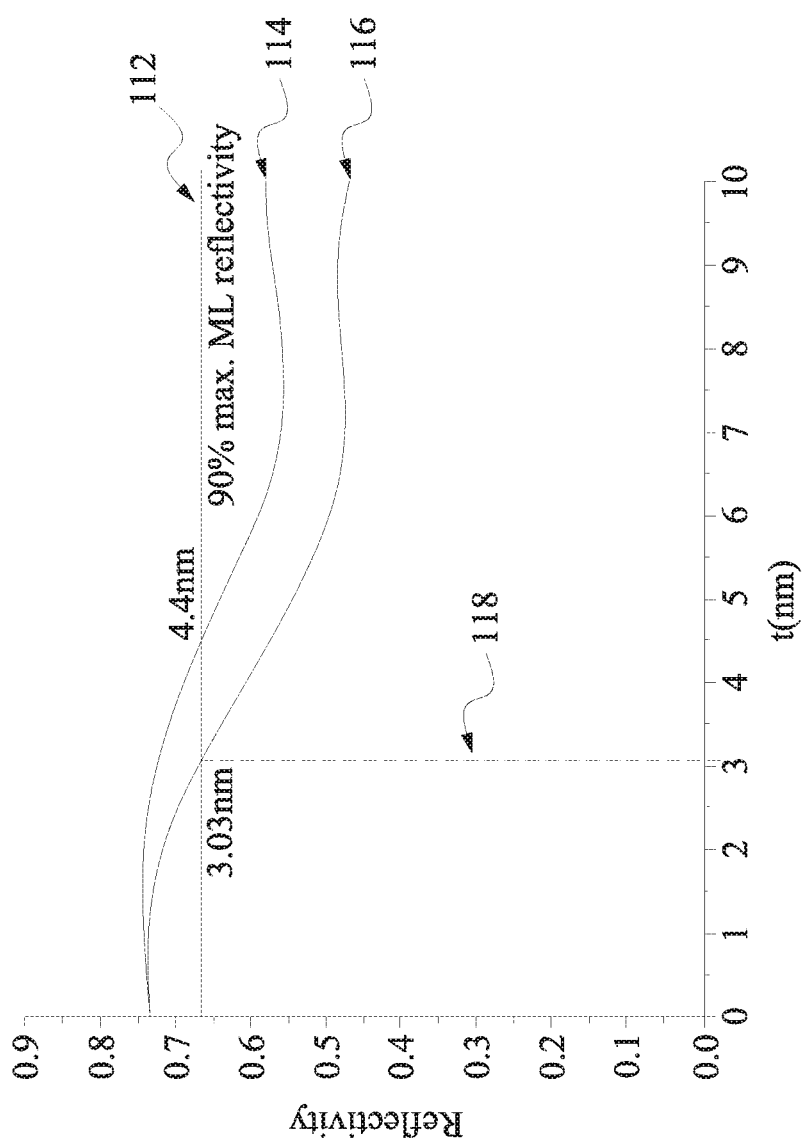
FIG. 2 is a diagram illustrating a characteristic data of a feature in the reflective mask of FIG. 1 in accordance with some embodiments.

Furthermore, the capping layer 106 of RuPt alloy has a thickness that is thick enough to provide anti-oxidation and etching resistance and thin enough without degrading the EUV reflectivity of the reflective mask 100. The reflectivity vs. thickness "t" of RuPt alloy is further studied in comparison with Ru, as shown in FIG. 2. Note that the reflectivity is measured as a collective reflectivity from the capping layer and the RML 104 in the current description. The horizontal axis represents the thickness "t" the capping layer in unit nanometer (nm). The vertical axis represents the reflectivity in percentage. For example, 0.9 means 90% reflectivity. When the thickness of the capping layer varies, the corresponding reflectivity varies accordingly. The reference line 112 stands for a minimum reflectivity for practical function of the reflective mask 100 when used in a lithography process. In the present example, the minimum reflectivity 112 is about 0.67. The curve 114 represents the reflectivity of Ru film and the curve 116 represents the reflectivity of RuPt alloy film. As illustrated in FIG. 2, RuPt alloy provides less EUV reflectivity than that of Ru film when being evaluated at a same thickness. If requiring that the reflectivity of the RuPt alloy film be at least the minimum reflectivity 112 or greater, the thickness of the RuPt alloy film needs to be 3.03 nm or less, as indicated by the dashed line 118. With consideration of two opposite factors (one being anti-oxidation and etch resistance and another being reflectivity), the thickness of the capping layer 106 of RuPt alloy ranges between 2 nm and 3 nm in accordance with some embodiments. In the furtherance of the embodiments, the capping layer 106 of RuPt alloy has a thickness about 2.5 nm, plus or minus 10%.

Referring back to FIG. 1, the capping layer 106 is designed with other composition and is formed by other method. In some embodiments, the capping layer 106 includes at least of titanium, silicon and zirconium doped by at least of oxygen and nitrogen. In the present examples, the capping layer 106 is formed by deposition and plasma treatment to the deposited layer using at least one of oxygen and nitrogen. The plasma treatment is controlled such that dopant is only introduced to the capping layer without further introducing to the RML 104. This capping layer is oxidized or nitrogenized Ti, Zr or Si film. The structure of this capping layer and the method making the same will be further described in details at later stage.

Still referring to FIG. 1, the reflective mask 100 includes an absorber layer 108 formed on the capping layer 106. The absorber layer 108 is deposited on the capping layer 106 and is further patterned to define an IC pattern thereon, such as according to an IC design layout. The absorber layer 108 is designed to absorb radiation light (such as EUV light) during a lithography exposing process. The radiation light passes through the openings of the absorber layer 108 and is reflected by the RML 104, thus the IC pattern is imaged to an IC substrate, such as a silicon wafer. In the present embodiment, the absorber layer 108 includes tantalum boron nitride (TaBN). In another embodiment, the absorber layer 108 includes chromium (Cr), chromium oxide (CrO), titanium nitride (TiN), tantalum nitride (TaN), tantalum (Ta), titanium (Ti), or aluminum-copper (Al—Cu), palladium, tantalum boron nitride (TaBN), aluminum oxide (AlO), molybdenum (Mo), and other suitable materials. In yet another embodiment, the absorber layer 108 includes multiple layers. In one example, the absorber layer 108 is deposited by a deposition technique, such as chemical vapor deposition (CVD), and is patterned by a suitable procedure, such as electron-beam lithography process and etching.

Figure 3:
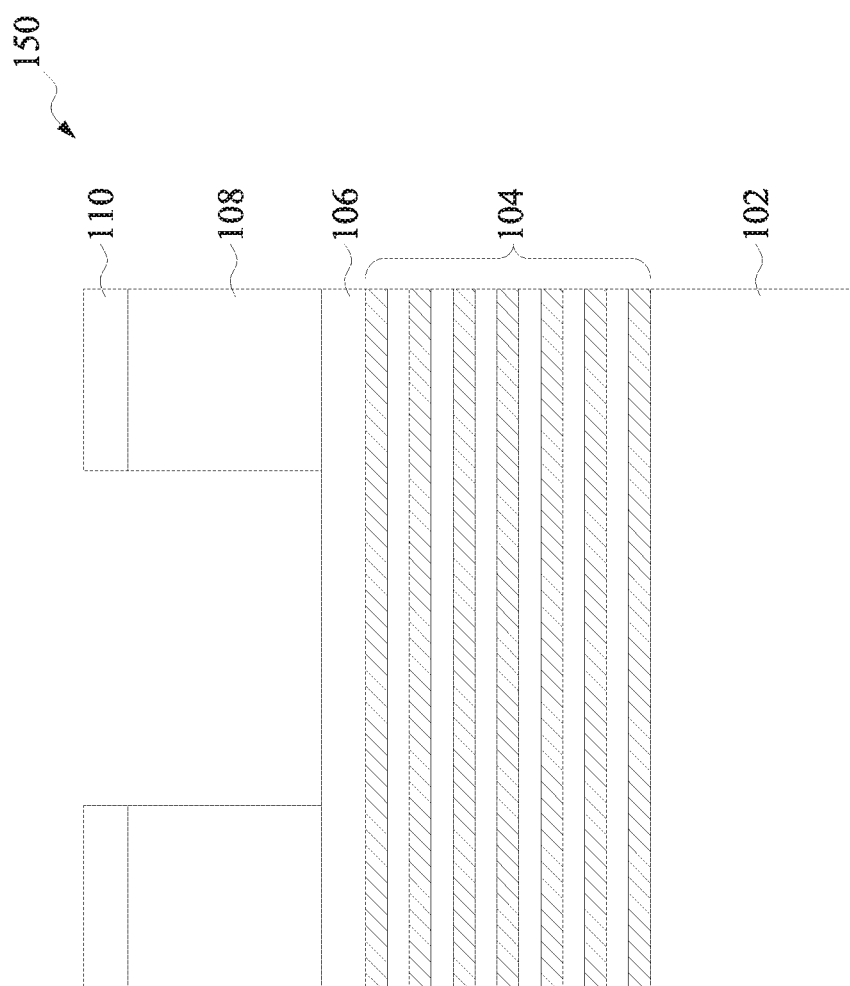
FIG. 3 is a sectional view of a reflective photo mask used in a EUV lithography exposing tool in accordance with some embodiments.

FIG. 3 is a sectional view of a reflective mask 150 constructed according to another embodiment. The reflective mask 150 includes a substrate 102, a RML 104, a capping layer 106 and an absorber layer 108. These material layers are similar to corresponding ones in the reflective mask 100 in terms of composition, configuration and formation. Additionally, the reflective mask 150 further includes a protection layer 110 disposed on the absorber layer 108. In some embodiments, the protection layer 110 may protect the absorber layer 108 from an oxidation of the high absorbing material when the mask is in cleaning process. Furthermore, some of the absorber layer 108 has poor clean resistance and the protection layer 110 can enhance the cleaning durability.

The protection layer 110 is chosen to provide effective protection to the absorber layer 108, such as protection from oxidation, etching or damaging during subsequent processes that include etching and cleaning. In some embodiments, the protection layer 110 is similar to the capping layer 106 in term of composition. In various embodiments, the protection layer 110 includes Ru, Ru alloy, oxidized or nitrogenized Ti, Zr or Si, or other suitable material. In other embodiments, some other material may be used to form the protection layer 110. In one embodiment, a SiC film is formed as the protection layer 110.

The protection layer 110 is patterned such that to be disposed only on the patterned absorber layer 108. In one embodiment to form the reflective mask 150, the absorber layer 108 is deposited and the protection layer 110 is deposited on the absorber layer 108, then a patterning procedure including lithography process and etching is applied to pattern both the absorber layer 108 and the protection layer 110. The etching may include one etch step, such as a dry etching, or two etch steps, such as two wet etch steps, to sequentially pattern the absorber layer 108 and the protection layer 110.

Figure 4:
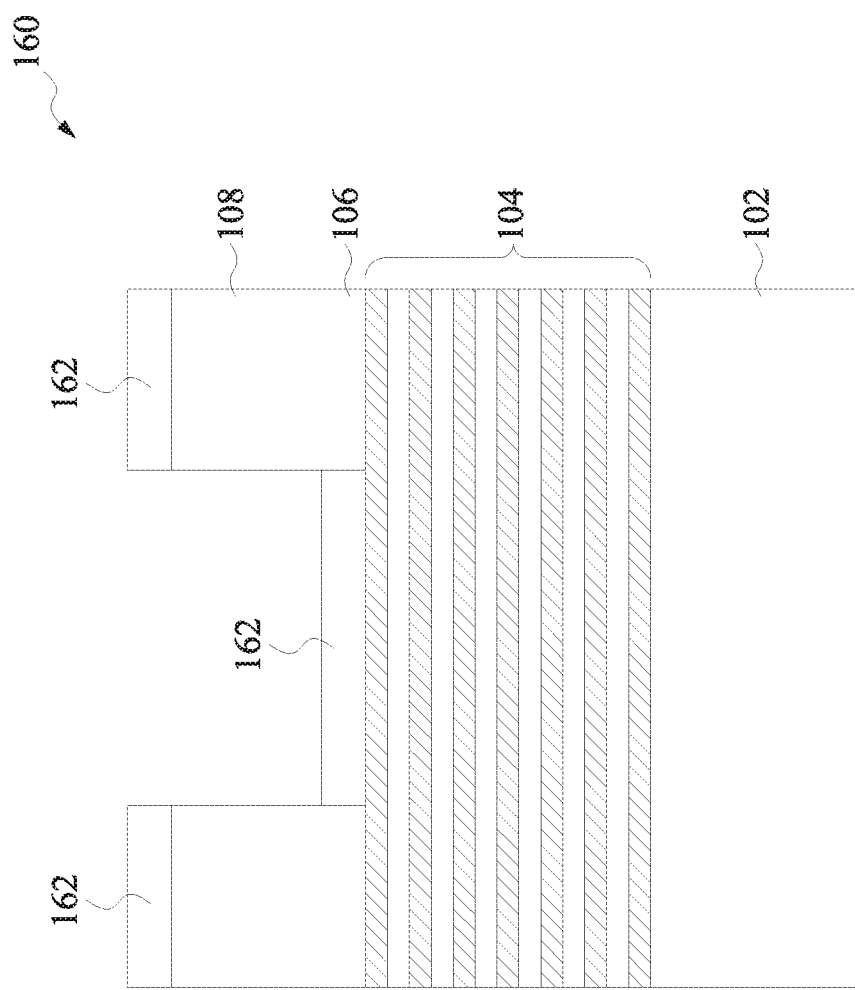
FIG. 4 is a sectional view of a reflective photo mask used in a EUV lithography exposing tool in accordance with some embodiments.

FIG. 4 is a sectional view of a reflective mask 160 constructed according to another embodiment. The reflective mask 160 includes a substrate 102, a RML 104, and an absorber layer 108. These material layers are similar to those in the reflective mask 100 in terms of composition and formation. The reflective mask 160 further includes a capping layer 162 disposed on the absorber layer 108 and the RML 104 at different depths, thus providing protection to both the RML 104 and the absorber layer 108 from various processing damages, such as oxidation or etch loss. In the procedure to form the reflective mask 160, the absorber layer 108 is deposited on the RML 104 and is further patterned to define an IC pattern. The capping layer 162 is deposited on the absorber layer 108, and the RML 104 within the openings of the absorber layer 104.

The capping layer 162 may be additionally deposited on the sidewalls of the absorber layer layer 108. In this case, the capping layer 162 is designed with composition, morphology and thickness similar to those of the capping layer of the reflective mask 100 in FIG. 1. Particularly, the capping layer 162 includes is a material in amorphous structure with an average interatomic distance less than a kinetic diameter of oxygen ($O_2$). In some embodiments, the capping layer 162 includes an alloy of Ru and a metal that is highly oxygen unreactive, such as Pt. In some embodiments, the capping layer 162 includes at least one of titanium, silicon and zirconium doped by at least one of oxygen and nitrogen.

However, the capping layer 162 is formed after the absorber layer 108 is patterned. Furthermore, the capping layer 162 itself is deposited but not patterned. It includes first portion directly on the RML 104 and second portion directly on the absorber layer 108. The first and second portions of the capping layer 162 are at different levels.

Figure 5:
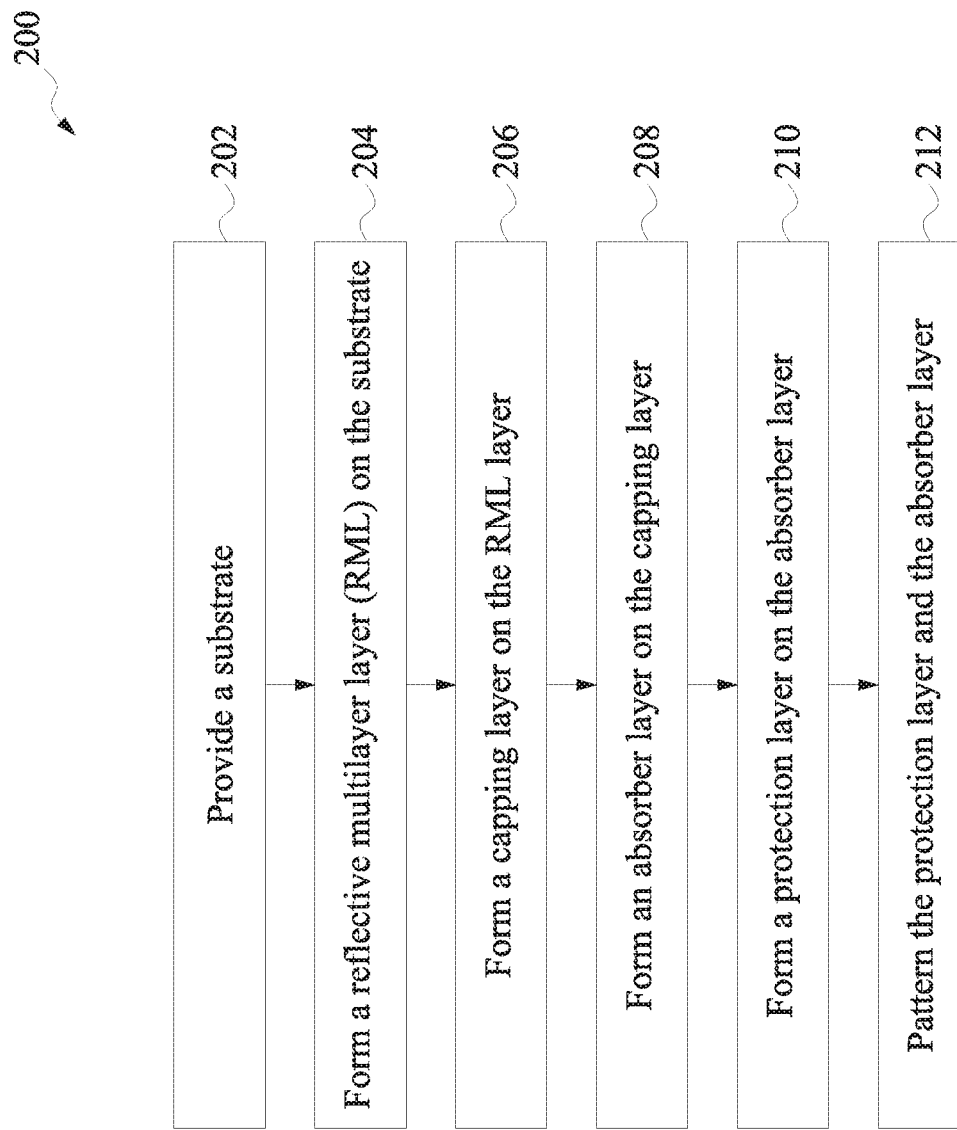
FIG. 5 is a flowchart of a method making a reflective photo mask used in a EUV lithography exposing tool in accordance with some embodiments.

FIG. 5 is a flowchart of a method 200 to form a reflective mask, such as the mask 100, mask 150 or mask 160, according to some embodiments. The method 200 is described with reference to FIGS. 3 and 5. The method 200 begins at 202 by providing a substrate 102. The substrate 102 is chosen to minimize image distortion due to mask heating by the intensified illumination radiation. In the present embodiments, the substrate 102 includes a LTEM. The LTEM may include fused quartz, silicon carbide, silicon oxide-titanium oxide alloy and/or other suitable LTEM known in the art. Alternatively, the substrate 102 includes other materials, such as quartz or glass, depending on design requirements of the mask.

The method 200 proceeds to operation 204 by forming a RML layer 104 on the substrate 102. In one embodiment, the RML 104 includes alternating layers of two materials deposited on the top of the substrate 102 to act as a Bragg reflector that maximizes the reflection of the radiation light, such as EUV with 13.5 nm wavelength. The combination of the two materials in the alternating layers selected to provide a large difference in refractive indices between the two layers and further to provide small extinction coefficients or minimized absorption. In an example, the RML 104 includes molybdenum-silicon (Mo/Si) layer pairs. In another example, the RML 104 includes molybdenum-beryllium (Mo/Be) layer pairs. The RML 104 is formed by PVD or other suitable technique. For example, Mo and Be are alternatively deposited to form the RML 104 using PVD or other suitable deposition technique. In furtherance of the example, the substrate 102 is deposited with a Mo layer using a Mo target by sputtering and is deposited with a Si layer using a Si target by sputtering. This processing cycle is repeated until a number of the Mo/Si layer pairs are formed. In one example, the number of layer pairs of the RML 104 ranges from 20 to 80. In another example, the Mo/Si pairs includes a silicon layer having a thickness of about 3 nm to 5 nm and a molybdenum layer having a thickness of about 2 nm to 4 nm.

The method 200 proceeds to operation 206 by forming a capping layer 106 on the RML layer 104. The capping layer 106 is formed by PVD or other suitable technique. The capping layer 106 includes an anti-oxidation barrier layer having an amorphous structure with an average interatomic distance less than the kinetic diameter of oxygen ($O_2$), which is 3 angstrom. In various embodiments, the capping layer 106 includes RuM alloy, in which M is a highly oxygen unreactive metal, such as Pt, or at least one of titanium, silicon and zirconium doped by at least one oxygen and nitrogen.

The method 200 proceeds to operation 208 by forming an absorber layer 108 on the capping layer 106. In the present embodiment, the absorber layer 108 includes tantalum boron nitride (TaBN). In another embodiment, the absorber layer 108 includes chromium (Cr), chromium oxide (CrO), titanium nitride (TiN), tantalum nitride (TaN), tantalum (Ta), titanium (Ti), or aluminum-copper (Al—Cu), palladium, tantalum boron nitride (TaBN), aluminum oxide (AlO), molybdenum (Mo), and other suitable materials. In yet another embodiment, the absorber layer 108 includes multiple layers. In one example, the absorber layer 108 is deposited by a deposition technique, such as CVD, PVD or other suitable technique.

The method 200 proceeds to operation 210 by forming a protection layer 110 on the absorber layer 108. The protection layer 110 may include a material similar to that of the capping layer 106 in terms of composition and formation.

The method 200 proceeds to operation 212 by patterning the protection layer 110 and the absorber layer 108. In one embodiment, the operation 212 includes a lithography process and an etching process. The lithography process includes coating the mask 150 by a resist layer, applying a radiation beam (such as an electron-beam) to expose the resist layer and develop the resist layer to form a patterned resist layer. The lithography process may further include other steps, such as soft baking, post-exposure-baking or hard baking. The etching process may include one or more etch steps. In one example, the etching process includes one dry etch to etch both the protection layer 110 and the absorber layer 108. In another example, the etching process includes two etch steps each having etchant selectively etch the respective material layer (such as the protection layer 110 or the absorber layer 108).

In another embodiment, when the method 200 is used to form the reflective mask 100 (illustrated in FIG. 1) where the protection layer 110 is eliminated, the method 200 skips the operation 210. Furthermore, the operation 212 is designed to only pattern the absorber layer 108.

In yet another embodiment, when the method 200 is used to form the reflective mask 160 (illustrated in FIG. 4) where the capping layer 162 is formed on both the RML 104 and the absorber layer 108, the method 200 skips the operation 206 and the operation 212 is designed to only pattern the absorber layer 108. Furthermore, the operation 210 is implemented after the operation 212, thus forming the capping layer 162 directly on both the absorber layer 108 and the RML 104 on respective regions.

Figure 6:
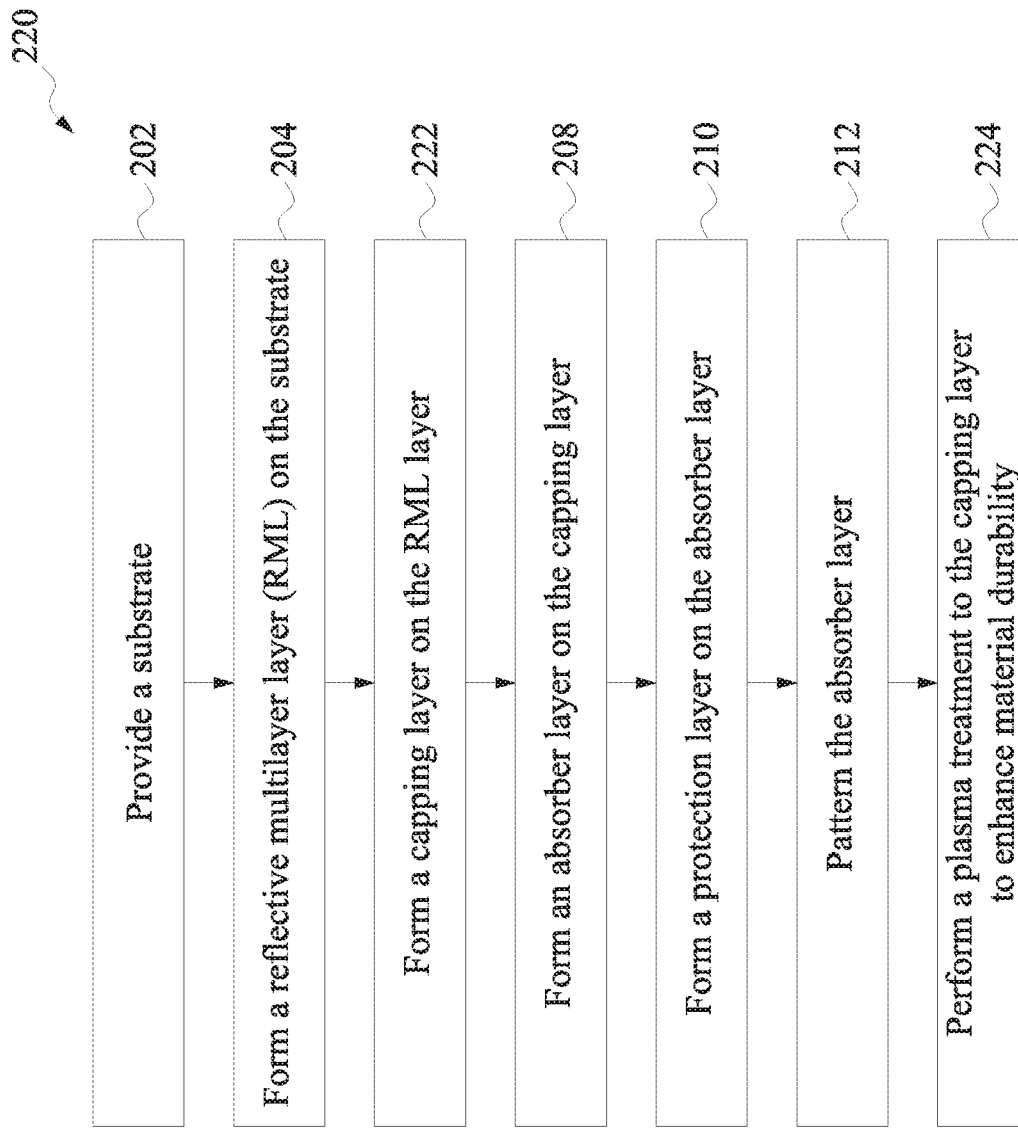
FIG. 6 is a flowchart of a method making a reflective photo mask used in a EUV lithography exposing tool in accordance with some embodiments.
Figure 8:
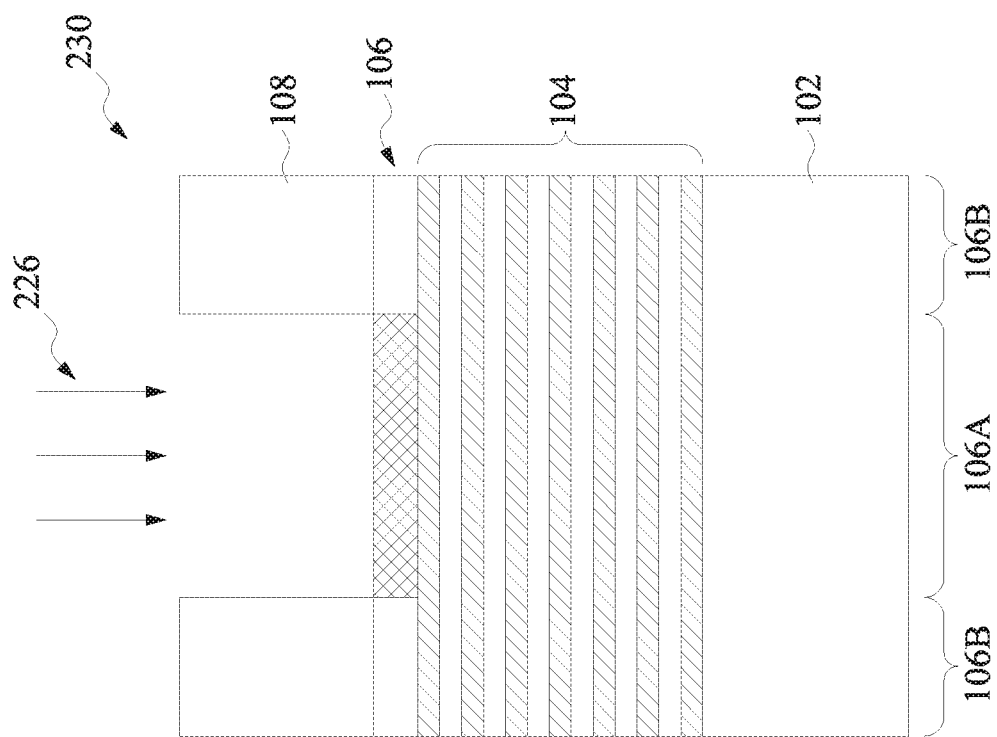
FIGS. 7 and 8 are sectional views of a reflective photo mask made by the method of FIG. 6 in accordance with some embodiments.
Figure 7:
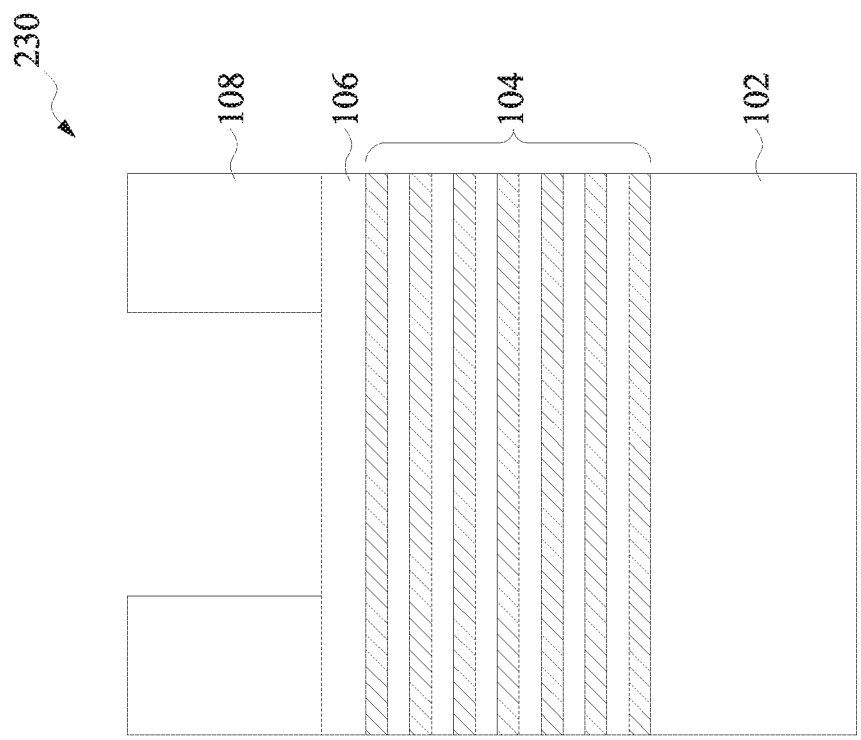

FIG. 6 is a flowchart of a method 220 to form a reflective mask 230 according to some embodiments. The reflective mask 230 is illustrated in FIGS. 7 and 8 in sectional views. Particularly, the capping layer 106 of the reflective mask 230 is an oxidized or nitrogenized material. The method 220 is described with reference to FIGS. 6 through 8. The some operations of the method 220 are similar to those of the method 200. Similar languages are eliminated for simplicity. The method 220 begins at 202 by providing a substrate 102. The substrate 102 includes LTEM in the present embodiments.

The method 220 proceeds to operation 204 by forming a RML layer 104 on the substrate 102. In one embodiment, the RML 104 includes alternating layers of two materials deposited on the top of the substrate 102 to act as a Bragg reflector that maximizes the reflection of the radiation light. In an example, the RML 104 includes molybdenum-silicon (Mo/Si) layer pairs. In another example, the RML 104 includes molybdenum-beryllium (Mo/Be) layer pairs.

The method 220 proceeds to operation 222 by forming a capping layer 106 on the RML layer 104. The capping layer 106 includes titanium, silicon, zirconium or a combination thereof. In some embodiments, the capping layer 106 includes $SiO_2$, $TiO_2$, $ZrO_2$, $ZnO$, $SnO_2$, W, $SrTiO_3$, $Nb_2O_5$, or $KTaO_3$. The capping layer 106 is deposited by a suitable technique, such as PVD or chemical vapor deposition (CVD). The thickness of the capping layer 106 is controlled in a certain range so that the EUV reflectivity is not degraded. This will be further discussed at the operation 224.

The method 220 proceeds to operation 208 by forming an absorber layer 108 on the capping layer 106. In the present embodiment, the absorber layer 108 includes TaBN. In other embodiments, the absorber layer 108 includes chromium (Cr), chromium oxide (CrO), titanium nitride (TiN), tantalum nitride (TaN), tantalum (Ta), titanium (Ti), or aluminum-copper (Al—Cu), palladium, tantalum boron nitride (TaBN), aluminum oxide (AlO), molybdenum (Mo), and other suitable materials. The absorber layer 108 may be deposited by a deposition technique, such as CVD, PVD or other suitable technique.

The method 220 may include an operation 210 by forming a protection layer on the absorber layer 108, such as the protection layer 110 in FIG. 3. Alternatively, the protection layer may be eliminated in some embodiments.

The method 220 proceeds to operation 212 by patterning the absorber layer 108 (and the protection layer 110 if it is present) according to an integrated circuit pattern. In one embodiment, the operation 212 includes a lithography process and an etching process. The patterned absorber layer 108 includes one or more openings such that the portions of the underlying capping layer 106 within the openings are uncovered by the absorber layer.

The method 220 proceeds to operation 224 by performing a plasma process (or plasma treatment) 226 to the capping layer 106 using at least one of oxygen and nitrogen, thereby oxidizing or nitrogenizing the capping layer 106 as illustrated in FIG. 8. Various relevant factors are identified and studied regarding the capping layer 106, especially for its various functions in the mask. The plasma process is designed by taking various considerations related to those factors, which are described previously and are further described below.

The plasma process is designed to introduce at least one of oxygen and nitrogen to the capping layer such that it is densified to enhance effective anti-oxidation. Particularly, the plasma treated capping layer 106 is oxidized or nitrogenized to have a tightly-packed structure so that the average interatomic distance is less than the kinetic diameter of oxygen (O2), which is 3 angstrom. Especially, the plasma treated capping layer 106 is in amorphous structure for anti-oxidation. To avoid polycrystalline structure being formed in the capping layer, the plasma process is properly designed for that consideration. In other aspects, the plasma process 226 is controlled and tuned such that the oxygen (and/or nitrogen) is not introduced to the RML 104, in order to maintain the reflectivity of the RML 104. In some embodiments, the plasma process is applied to the capping layer 106 with a plasma source power ranging between 300 w and 1000 w; plasma bias power ranging between 0 and 50 w; gas flow of the gas ranging between 100 sccm and 500 sccm; chamber pressure ranging between 1 mTorr and 10 mTorr; and plasma treatment duration ranging between 30 sec and 300 sec.

After the capping layer being plasma treated by oxygen and nitrogen, the grains of material shrink and the capping layer is transferred to amorphous. This is used to provide anti-oxidation barrier, where the amorphous phase means fewer diffusion paths than with polycrystalline structure. Nitrogenizing of the capping layer increases its hardness and etching resistance as well. Please treated capping layer also gains self-cleaning function. For example, the plasma treated capping layer includes hydroxyl radical (.OH), and/or superoxide anion (.O2-) that can be reacted with the contaminants (such as carbon) to form chemical (such $CO_2$) to be volatilized from the contaminated surface.

Figure 9:
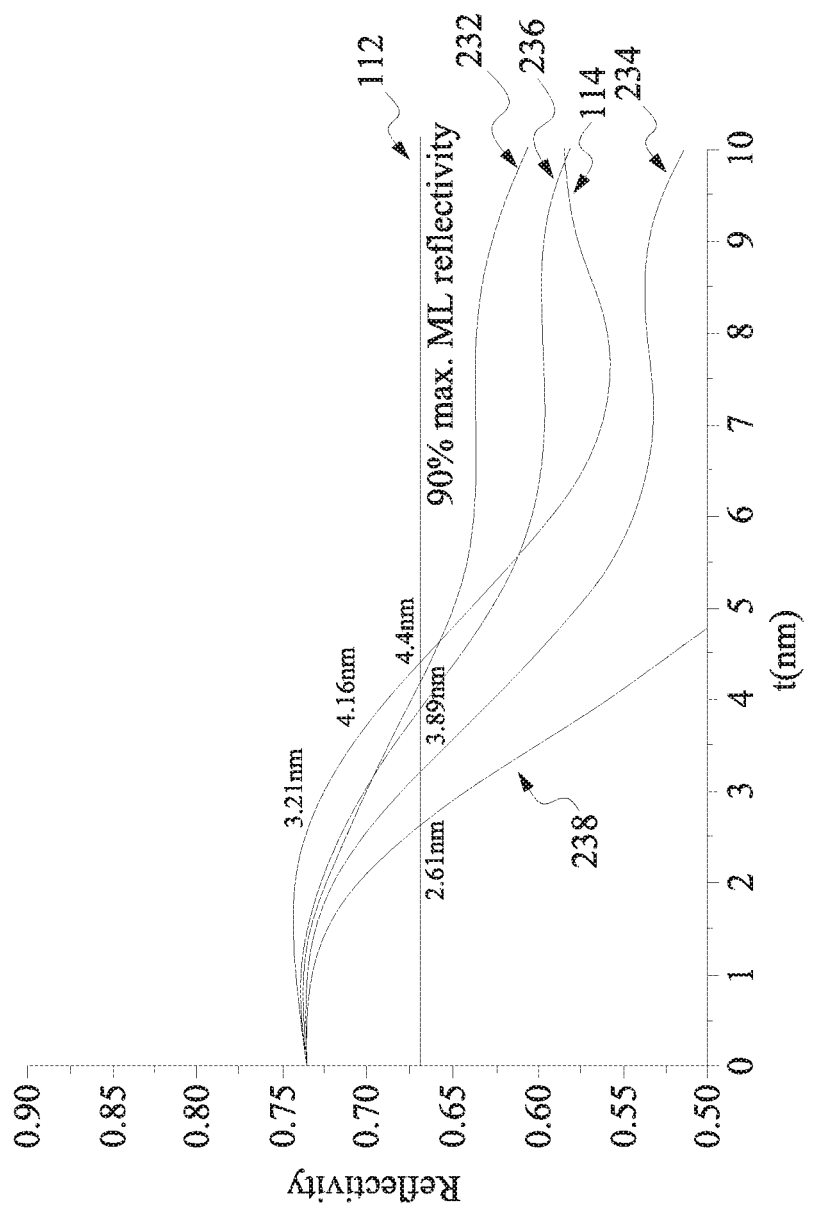
FIG. 9 is a diagram illustrating a characteristic data of a feature in the reflective mask of FIG. 8 in accordance with some embodiments.

Furthermore, the thickness of the capping layer 106 is related to the reflectivity. The thickness of the capping layer 106 is controlled to be thick enough for anti-oxidation and etch resistance and but thin enough without substantially degrading the reflectivity. FIG. 9 illustrates various materials for its corresponding EUV reflectivity. FIG. 9 is similar to FIG. 2 but with data from oxidized or nitrogenized materials. The horizontal axis represents the thickness "t" the capping layer in unit nanometer (nm). The vertical axis represents the reflectivity in percentage. The reference line 112 stands for a minimum reflectivity for practical function of the reflective mask 100 when used in a lithography process. In the present example, the minimum reflectivity 112 is about 0.67. The curve 114 represents the reflectivity of Ru film; the curve 232 represents the reflectivity of $SiO_2$; the curve 234 represents the reflectivity of $TiO_2$; the curve 236 represents the reflectivity of $ZrO_2$; and the curve 238 represents the reflectivity of CrN. Similarly, to meet the minimum reflectivity, each material has an upper thickness limit, which is the intersection between the reference line 112 and corresponding curve. The upper thickness limits are labeled on FIG. 9 as well. For examples, the CrN thickness is less than 2.61 nm; the $TiO_2$ thickness is less than 3.21 nm; the $ZrO_2$ thickness is less than 3.89 nm; and the $SiO_2$ thickness is less than 4.16 nm. With consideration of two opposite factors (one being anti-oxidation and etch resistance and another being reflectivity), the thickness of the capping layer 106 ranges between 2.5 nm and 4 nm in accordance with some embodiments. In some other embodiments, the thickness of the capping layer 106 is slightly less than the corresponding upper thickness limits "$T_0$", such as in a range between 70% $T_0$ and 95% $T_0$.

Referring back to FIG. 8, the plasma treatment is applied to the capping layer 106 through the openings of the absorber layer 108 using the absorber layer 108 as a plasma-treating mask that effectively blocks the covered portions of the capping layer from plasma treating. As illustrated in FIG. 8, the capping layer 106 includes first portion 106A uncovered by the absorber layer 108 and second portion 106B covered by the absorber layer 108. The first portion 106A is within the opening(s) of the absorber layer. After the plasma treatment 226, the first portion 106A is changed (oxidized or nitrogenized), while the second portion 106B remains free of plasma doping and therefore is different from the first portion 106A in composition.

In some other embodiments, the reflective mask in FIG. 8 has a configuration similar to that of the reflective mask 160 in FIG. 4 and the capping layer 106 is plasma treated. In this case, the method is similar to the procedure to form the mask 160. Particularly, after the formation of the absorber layer 108, the capping layer is deposited on both the RML 104 and the absorber layer 108 and is plasma treated by the operation 224.

Figure 10:
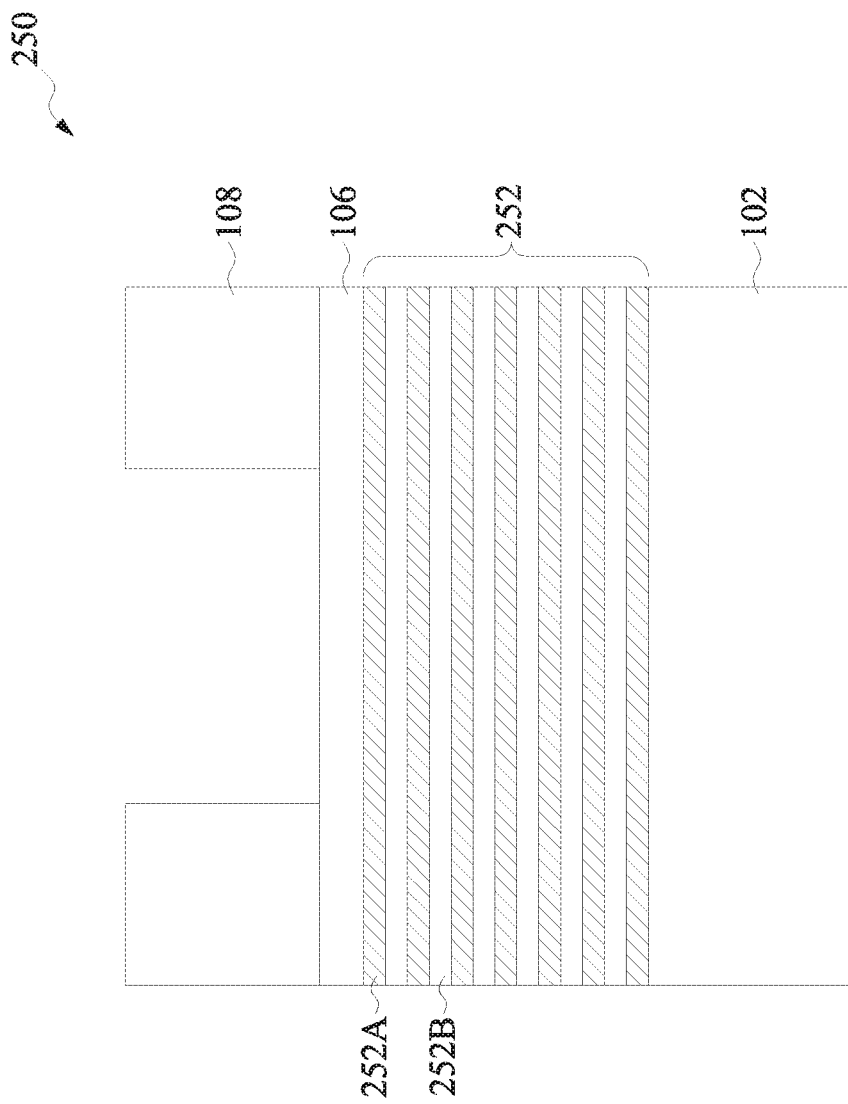
FIG. 10 is a sectional view of a reflective photo mask used in a EUV lithography exposing tool in accordance with some embodiments.

FIG. 10 illustrates a sectional view of a reflective mask 250 in accordance with some embodiments. The reflective mask 250 is similar to the reflective mask 100 in some aspects and different from in other aspects. The similar languages are not repeated. The reflective mask 250 includes a substrate 102. In the present embodiments, the substrate 102 includes a LTEM, such as fused quartz, silicon carbide, silicon oxide-titanium oxide alloy and/or other suitable LTEM.

The reflective mask 250 includes a reflective multilayer (RML) 252 disposed on the substrate 102. The RML 252 will be further discussed later.

A capping layer 106 is deposited on the RML 104. Because the capping layer 106 has different etching characteristics from an absorber layer, the capping layer 106 provides a protection to the RML 252, such as an etch stop layer in a subsequent patterning or a repairing process of the absorber layer. Furthermore, the same capping layer 106 is also designed to function as an anti-oxidation barrier layer to protect the RML 252 from oxidation. At the same time, the capping layer will not degrade the EUV reflectivity from the RML 252. In various embodiments, the capping layer 106 is a Ru film, a RuM alloy or an oxidized/nitrogenized film as described above in various embodiments.

The reflective mask 250 includes an absorber layer 108 formed on the capping layer 106. The absorber layer 108 is deposited on the capping layer 106 and is further patterned to define an IC pattern thereon, such as according to an IC design layout. The absorber layer 108 is designed to absorb radiation light (such as EUV light) during a lithography exposing process.

Figure 11:
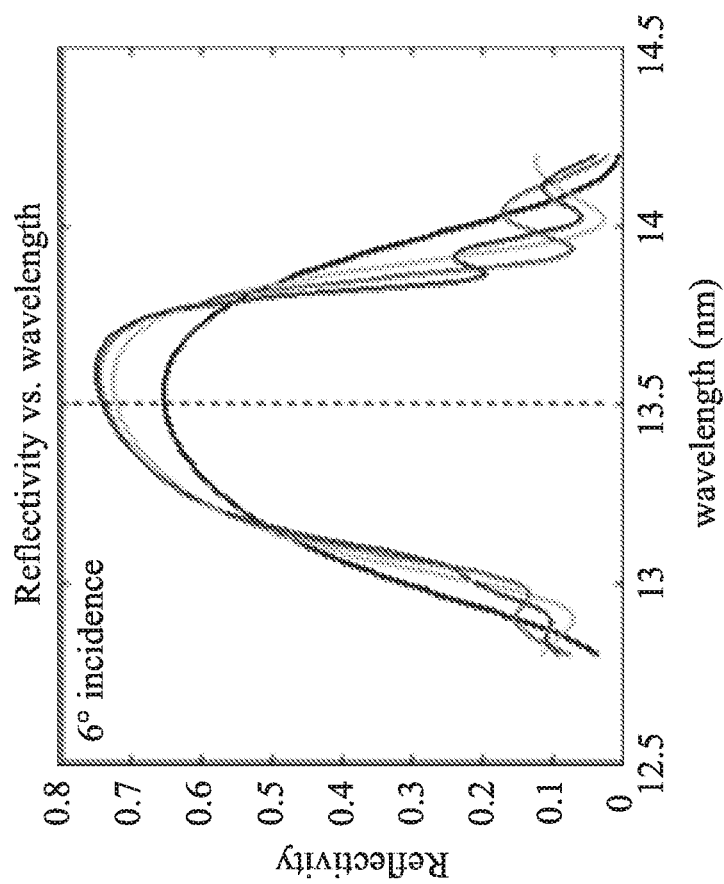
FIG. 11 is a diagram illustrating a characteristic data of a feature in the reflective mask of FIG. 10 in accordance with some embodiments.

Now going back to the RML 252. The RML 252 is designed to reflect of the radiation light directed to the substrate 102. The RML 252 includes alternating layers of two materials deposited on the top of the substrate 102 to act as a Bragg reflector that maximizes the reflection of the radiation light, such as EUV with 13.5 nm wavelength. In the present embodiments, the RML 104 includes molybdenum (Mo) layers 252A and silicon (Si) layers 252B in pairs. For example, in the depicted embodiment, to achieve more than 90% of the maximum achievable reflectivity of the RML 252, the RML 252 includes about forty Mo/Si layer pairs. In furtherance of the example, the Mo/Si pairs includes a silicon layer having a thickness of 3 nm to 5 nm (for example, about 4 nm); and a molybdenum layer having a thickness of 2 nm to 4 nm (for example, about 3 nm). However, the topmost film of the RML 252 is one of the Mo layers 252A. The capping layer 106 is in direct contact with the topmost Mo layer 252A. This is because Mo is less reactive with oxygen than silicon. With this configuration, the RML 252 is more durable to oxidation damage. Our experimental data in FIG. 11 illustrates that such configuration maintains the reflectivity of the RML 252. The data in FIG. 11 are reflectivity vs. wavelength while EUV is directed toward the mask with 6° tilt angle as in the current EUV lithography exposure. Various curves represent reflectivity data of the RML with 20 (alternating Mo/Si), 30, 40 and 60 layers, respectively.

Figure 12:
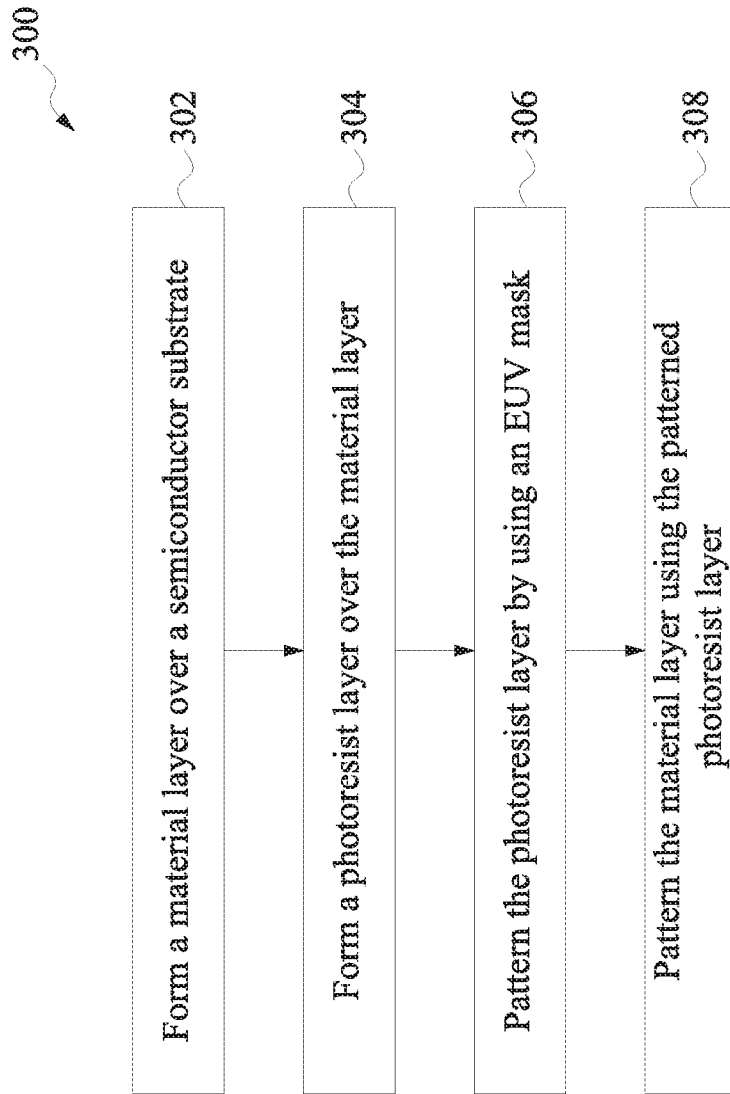
FIG. 12 is a flowchart of a method making an integrated circuit constructed in accordance with some embodiments.

FIG. 12 is a flowchart of a method 300 making an integrated circuit according to some embodiments. The method 300 starts with a semiconductor substrate or other suitable substrate to be patterned to form an integrated circuit thereon. In the present embodiment, the semiconductor substrate includes silicon. Alternatively or additionally, the semiconductor substrate includes germanium, silicon germanium or other suitable semiconductor material, such as diamond, silicon carbide or gallium arsenic. The semiconductor substrate may further include additional features and/or material layers, such as various isolation features formed in the substrate. The semiconductor substrate may include various p-type doped regions and/or n-type doped regions configured and coupled to form various devices and functional features. All doping features may be achieved using a suitable process, such as ion implantation in various steps and techniques. The semiconductor substrate may include other features, such as shallow trench isolation (STI) features. The semiconductor substrate may also include a portion of an interconnect structure that includes metal lines in various metal layers, via features to provide vertical connection between the metal lines in the adjacent metal layers, and contact features to provide vertical connection between the metal lines in the first metal layer and various device features (such as gates, sources and drains) on the substrate.

The method 300 includes an operation 302 to form a material layer over the semiconductor substrate (or other suitable substrate). As one embodiment for illustration, the material layer includes a dielectric material, such as an interlayer dielectric (ILD) to form conductive features (e.g., metal lines, vias or contacts) therein. The ILD layer may include silicon oxide, low dielectric material (with a dielectric constant less than that of the thermal silicon oxide). The ILD layer may include one or more dielectric films. The ILD layer may be deposited on the semiconductor substrate by chemical vapor deposition (CVD), spin-on coating or other suitable technique. The material layer may alternatively include other material to be patterned. For example, the material layer may include a conductive material, such as doped polysilicon, metal or metal alloy, to be patterned to form gate electrodes for the field effect transistors in the integrated circuit.

The method 300 proceeds to an operation 304 by forming a photoresist layer over the material layer. The photoresist layer is sensitive to the radiation from the exposing source during a subsequent photolithography exposing process. In the present embodiment, the photoresist layer is sensitive to EUV light used in the photolithography exposing process. The photoresist layer may be formed over the material layer by spin-on coating or other suitable technique. The coated photoresist layer may be further baked to drive out solvent in the photoresist layer.

The method 300 proceeds to an operation 306 by patterning the photoresist layer using an EUV mask. The EUV mask is a reflective mask designed for EUV lithography exposure and having a capping layer with strong anti-oxidation. In various embodiments, the EUV mask is the mask 100 described in FIG. 1; the mask 150 in FIG. 3; the mask 160 described in FIG. 4; the mask 230 in FIG. 8; or the mask 250 in FIG. 10.

The patterning of the photoresist layer includes performing a photolithography exposing process by an EUV exposing system using the EUV mask. During the exposing process, the IC design pattern defined on the EUV mask is imaged to the photoresist layer to form a latent patent thereon. The patterning of the photoresist layer further includes developing the exposed photoresist layer to form a patterned photoresist layer having one or more openings. In one embodiment where the photoresist layer is a positive tone photoresist layer, the exposed portions of the photoresist layer are removed during the developing process. The patterning of the photoresist layer may further include other process steps, such as various baking steps at different stages. For example, a post-exposure-baking (PEB) process may be implemented after the photolithography exposing process and before the developing process.

The method 300 proceeds to an operation 308 by patterning the material layer utilizing the patterned photoresist layer. In one embodiment, the patterning the material layer includes applying an etching process to the material layer using the patterned photoresist layer as an etch mask. The portions of the material layer exposed within the openings of the patterned photoresist layer are etched while the rest portions are protected from etching. In the present embodiment, the operation 308 forms various trenches in the ILD layer.

The method 300 may include other processing steps. For example, the patterned photoresist layer may be removed by wet stripping or plasma ashing after the operation 308. In another example, one or more conductive materials are filled (such as by deposition and polishing) in the trenches of the ILD layer to form corresponding conductive features (such as metal lines) for electrical routing.

In alternative embodiment, the method 300 may include the operations 304, 306 and 308 to form doped features in the semiconductor substrate. In this case, the patterned photoresist layer formed by the operations 304 and 306 is used as an ion implantation mask and the operation 308 includes performing an ion implantation process to the semiconductor substrate. The ion implantation process introduces dopant species to the semiconductor substrate through the openings of the patterned photoresist layer.

The present disclosure provides a reflective mask and the method making the same in accordance with various embodiments. In some embodiments, the reflective mask includes a capping layer that is in amorphous structure with an average interatomic distance less than a kinetic diameter of oxygen ($O_2$). For example, the capping layer includes RuPt alloy. In other examples, the capping layer includes oxidized or nitrogenized titanium, silicon or zirconium material. Some embodiments of the present disclosure offer advantages over existing art, though it is understood that other embodiments may offer different advantages, not all advantages are necessarily discussed herein, and that no particular advantage is required for all embodiments. The reflective mask has a strong capability of anti-oxidation and etching resistance without degrading the EUV reflectivity. In the capping layer plasma treated by oxygen and nitrogen, the grains of material shrink and the capping layer is transferred to an amorphous structure. The amorphous structure means fewer diffusion paths than polycrystalline structure and functions as an anti-oxidation barrier. Furthermore, nitrogenizing of the capping layer increases its hardness and etching resistance as well. In other aspects, titanium oxide and zinc oxide have shown to be an excellent photocatalyst with a long term stability, low-cost preparation, and a strong enough oxidizing power, which is useful for the decomposition of organic pollutants. These properties can be applied to glass, tile, filters, and many other materials to enable self-cleaning, deodorizing, self-sterilizing, anti-fogging, anti-fouling, and air-cleaning functions. These characteristics are based on the photogenerated active oxygen species, which include hydroxyl radical (.OH), superoxide anion (.O2-).

Thus, the present disclosure provides a reflective mask in accordance with some embodiments. The reflective mask includes a substrate; a reflective multilayer disposed on the substrate; an anti-oxidation barrier layer disposed on the reflective multilayer and the anti-oxidation barrier layer is in amorphous structure with an average interatomic distance less than an oxygen diameter; and an absorber layer disposed on the anti-oxidation barrier layer and patterned according to an integrated circuit layout.

The present disclosure also provides a reflective mask in accordance with some other embodiments. The reflective mask includes a substrate of a low thermal expansion material; a reflective multilayer formed on the substrate, wherein the reflective multilayer includes a plurality of alternating molybdenum-silicon (Mo/Si) films having a top Mo film; a capping layer of a material formed on the reflective multilayer, wherein the capping layer is disposed on and directly contacts the top Mo film of the reflective multilayer; and an absorber layer disposed on the capping layer and patterned according to an integrated circuit layout.

The present disclosure provides a method for forming a reflective mask in accordance with some embodiments. The method includes forming a reflective multilayer on a substrate of a low thermal expansion material; forming a capping film of a material that is selected from the group consisting of titanium, silicon and zirconium; forming an absorber layer on the capping film; patterning the absorber layer according to an integrated circuit layout, thereby forming an opening in the absorber layer, wherein a first portion of the capping film within the opening is not covered by the absorber layer; and performing a plasma process to the capping film through the opening using a gas containing at least one of oxygen and nitrogen, wherein the first portion of the capping film is thereby doped by the one of oxygen and nitrogen.

The present disclosure also provides a method for forming an integrated circuit in accordance with some embodiments. The method includes forming a photoresist layer over a semiconductor substrate; and performing a photolithography process to the photoresist layer using a photomask. The photomask includes a substrate of low thermal expansion material; a reflective multilayer disposed on the substrate; an anti-oxidation barrier layer disposed on the reflective multilayer; and an absorber layer disposed on the anti-oxidation barrier layer and patterned according to an integrated circuit layout. The anti-oxidation barrier layer is in amorphous structure with an average interatomic distance less than an oxygen diameter. In some embodiments, the anti-oxidation barrier layer includes an alloy of ruthenium and platinum. In some other embodiments, the anti-oxidation barrier layer includes at least of titanium, silicon and zirconium doped with at least one of oxygen and nitrogen.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A mask comprising:
   a substrate;
   a reflective multilayer disposed on the substrate;
   a barrier layer disposed on the reflective multilayer, the barrier layer having a structure with an average interatomic distance less than a kinetic diameter of oxygen; and
   an absorber layer disposed on the reflective multilayer.

2. The mask of claim 1, wherein the absorber layer interfaces with the reflective multilayer.

3. The mask of claim 1, wherein the barrier layer is positioned between the absorber layer and the reflective multilayer thereby preventing the absorber layer from interfacing with the reflective multilayer.

4. The mask of claim 1, wherein the barrier layer includes a first portion disposed directly on a top surface of the reflective multilayer, the top surface of the reflective multilayer facing away from the substrate, and
   wherein the barrier layer includes a second portion disposed directly on a top surface of the absorber layer, the top surface of the absorber layer facing away from the substrate.

5. The mask of claim 1, further comprising a protective layer disposed on the absorber layer, the protective layer includes either a first material or a second material,
   wherein the first material includes one of Ti, Si and Zr doped by oxygen or nitrogen, and
   wherein the second material includes Ru or Ru alloy.

6. The mask of claim 1, wherein the structure is an amorphous structure.

7. The mask of claim 1, wherein the barrier layer includes an alloy of ruthenium and a metal selected from the group consisting of Po, Hg, Os, Rh, Pd, Ir, and Pt.

8. The mask of claim 1, wherein the reflective multilayer includes either a plurality of alternating molybdenum-silicon (Mo/Si) films or a plurality of alternating molybdenum-beryllium (Mo/Be) films.

9. The mask of claim 1, wherein the absorber layer includes a material selected from the group consisting of tantalum boron nitride (TaBN), chromium (Cr), chromium oxide (CrO), titanium nitride (TiN), tantalum nitride (TaN), tantalum (Ta), titanium (Ti), or aluminum-copper (Al—Cu), palladium, aluminum oxide (AlO), molybdenum (Mo).

10. A mask comprising:
a substrate;
a reflective multilayer disposed on the substrate, wherein the reflective multilayer includes a plurality of alternating film layers;
a capping layer disposed directly on the the reflective multilayer, and wherein the capping layer includes a metal selected from the group consisting of Po, Hg, Os, Rh, Pd, Ir, and Pt; and
an absorber layer disposed on the capping layer.

11. The mask of claim 10, wherein the capping layer further includes an alloy of Ru.

12. The mask of claim 10, wherein the capping layer includes RuPt alloy.

13. The mask of claim 12, wherein the RuPt alloy of the barrier layer has a Ru:Pt mass ratio in a range from 1:1 to 3.5:1.

14. The mask of claim 10, wherein the reflective multilayer includes either a plurality of alternating molybdenum-silicon (Mo/Si) films or a plurality of alternating molybdenum-beryllium (Mo/Be) films.

15. The mask of claim 10, wherein the capping layer has an amorphous structure.

16. A mask comprising:
a substrate;
a reflective multilayer disposed on the substrate;
an absorber layer disposed on the reflective multilayer; and
a capping layer disposed on the reflective multilayer, the capping layer including a first portion that includes a dopant and is not covered by the absorber layer and a second portion that is free of the dopant and is covered by the absorber layer.

17. The mask of claim 16, wherein the dopant is selected from the group consisting of oxygen and nitrogen.

18. The mask of claim 16, wherein the second portion includes a material selected from the group consisting of Ti, Si and Zr and the first portion includes the material doped by oxygen or nitrogen.

19. The mask of claim 16, wherein the first portion has a structure with an average interatomic distance less than a kinetic diameter of oxygen.

20. The mask of claim 16, wherein the second portion of the capping layer extends from the reflective multilayer to the absorber layer.

* * * * *